(12) United States Patent
Tseng et al.

(10) Patent No.: US 9,263,641 B2
(45) Date of Patent: Feb. 16, 2016

(54) LIGHT EMITTING DIODES

(75) Inventors: Wei-chun Tseng, Taichung (TW); Wei-Yu Yen, Taichung (TW); Fu-Bang Chen, Taichung (TW); Chih-Sung Chang, Taichung (TW)

(73) Assignee: HIGH POWER OPTO. INC., Taichung (TW)

( * ) Notice: Subject to any disclaimer, the term of this patent is extended or adjusted under 35 U.S.C. 154(b) by 276 days.

(21) Appl. No.: 13/464,544

(22) Filed: May 4, 2012

(65) Prior Publication Data

US 2013/0292734 A1 Nov. 7, 2013

(51) Int. Cl.
| | |
|---|---|
| *H01L 33/38* | (2010.01) |
| *H01L 33/40* | (2010.01) |
| *H01L 33/22* | (2010.01) |
| *H01L 33/32* | (2010.01) |

(52) U.S. Cl.
CPC ............. *H01L 33/40* (2013.01); *H01L 33/22* (2013.01); *H01L 33/32* (2013.01); *H01L 33/382* (2013.01)

(58) Field of Classification Search
None
See application file for complete search history.

(56) References Cited

U.S. PATENT DOCUMENTS

| 7,821,024 B2 * | 10/2010 | Jeong | 257/98 |
| 2008/0054289 A1 * | 3/2008 | Tsai et al. | 257/99 |
| 2010/0216270 A1 * | 8/2010 | Liu et al. | 438/47 |

* cited by examiner

*Primary Examiner* — Robert Carpenter
(74) *Attorney, Agent, or Firm* — Muncy, Geissler, Olds & Lowe, P.C.

(57) ABSTRACT

An electric contact structure adopted for an LED comprises a nitride middle layer and an N-type metal electrode layer. The LED includes an N-type semiconductor layer, a light emission layer and a P-type semiconductor layer that are stacked to form a sandwich structure. The nitride middle layer is patterned and formed on the N-type semiconductor layer. The N-type metal electrode layer is formed on the nitride middle layer and prevented from being damaged by diffusion of the metal ions as the nitride middle layer serves as a blocking interface, thus electric property of the N-type semiconductor layer can be maintained stable. The nitride middle layer would not be softened and condensed due to long-term high temperature, thereby is enhanced adhesion. Moreover, the N-type metal electrode layer further can be prevented from peeling off, hence is increased the lifespan of the LED.

8 Claims, 5 Drawing Sheets

US 9,263,641 B2

LIGHT EMITTING DIODES

FIELD OF THE INVENTION

The present invention relates to a light emitting diode (LED).

BACKGROUND OF THE INVENTION

Light emitting diode (LED) mainly includes multiple layers of semiconductor materials formed by epitaxy. Take a blue LED as an example, it mainly formed by III-nitride based epitaxial films.

Please refer to FIG. 1 for a conventional vertical LED. It comprise an N-type semiconductor layer 1, a light emission layer 2 and a P-type semiconductor layer 3, and under the P-type semiconductor layer 3 in this order a mirror layer 4, a buffer layer 5, a bonding layer 6, a silicon substrate 7 and a P-type electrode 8. The surface of the N-type semiconductor layer 1 can be treated in a coarse process to enhance light extraction efficiency. The LED also can have an N-type electrode 9 located thereon. When a voltage is applied to the N-type electrode 9 and P-type electrode 8, the N-type semiconductor layer 1 provides electrons, and the P-type semiconductor layer 3 provides electric holes, then the electrons and electric holes are joined in the light emission layer 2 to generate light.

The N-type electrode 9 generally is made of metal, such as silver, aluminum, nickel or the like. The N-type electrode 9 is easily softened and condensed to become spherical shape due to high temperature and results in peeling off. After used for a period of time, metal ions slowly permeate into the N-type semiconductor layer 1 that causes unstable electric property and results in shortening lifespan of the LED. It still leaves a lot to be desired, especially in terms of durability.

SUMMARY OF THE INVENTION

The primary object of the present invention is to provide an LED to enhance the lifespan thereof.

The light emitting diode according to the invention comprises a P-type electrode, an N-type semiconductor layer, a light emission layer, a P-type semiconductor layer, a nitride middle layer and an N-type metal electrode layer. The P-type semiconductor layer is electrically connected the P-type electrode. The light emission layer is formed on the P-type semiconductor layer and contacts the P-type semiconductor layer. The N-type semiconductor layer is formed on the light emission layer and contacts the light emission layer. The nitride middle layer is patterned and formed on the N-type semiconductor layer to contact the N-type semiconductor layer. The N-type metal electrode layer is formed on the nitride middle layer and only contacts the nitride middle layer. More specifically, the nitride middle layer is formed between the N-type semiconductor layer and the N-type metal electrode layer to prevent the N-type metal electrode layer from contacting the N-type semiconductor layer.

Through the nitride middle layer serving as a blocking interface, the N-type semiconductor layer can be protected by the blocking interface to be prevented from being damaged by diffusion of the metal ions, thereby electric property of the N-type semiconductor layer can be maintained stable. The nitride middle layer would not be softened and condensed to become spherical shape due to long-term high temperature, hence adhesion increases and the N-type metal electrode layer further can be prevented from peeling off. As a result, the lifespan of the LED increases.

The foregoing, as well as additional objects, features and advantages of the invention will be more readily apparent from the following detailed description, which proceeds with reference to the embodiments and accompanying drawings. The embodiments serve merely for illustrative purpose and are not the limitations of the invention.

DETAILED DESCRIPTION OF THE PREFERRED EMBODIMENTS

Figure 1:
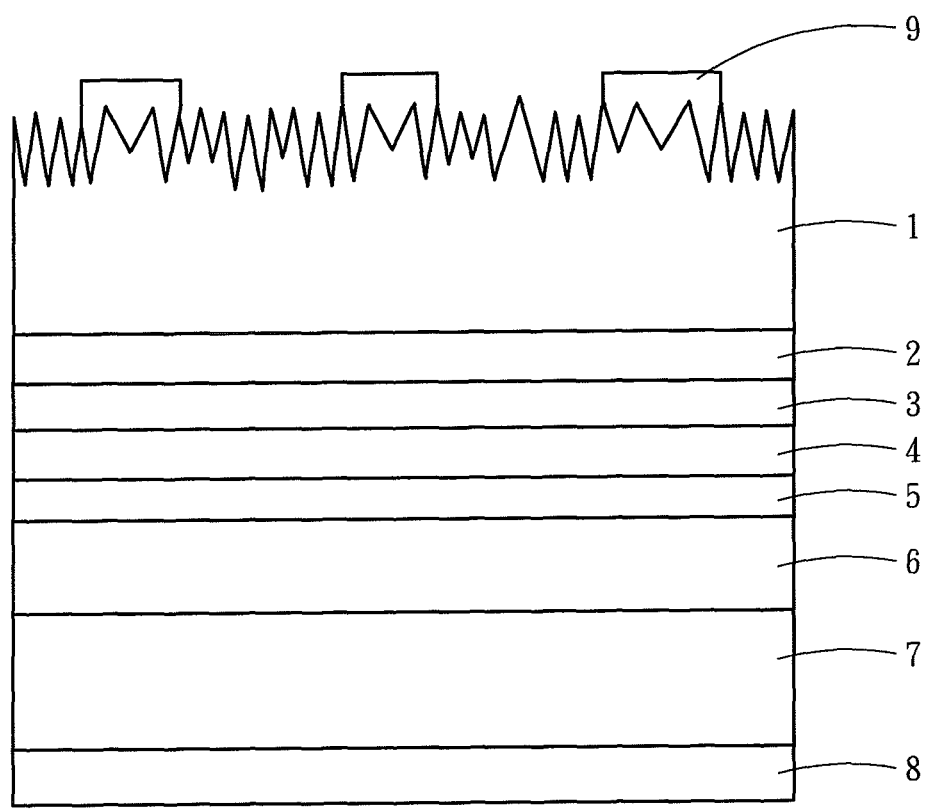
FIG. 1 is a schematic view of a conventional LED structure.
Figure 2A:
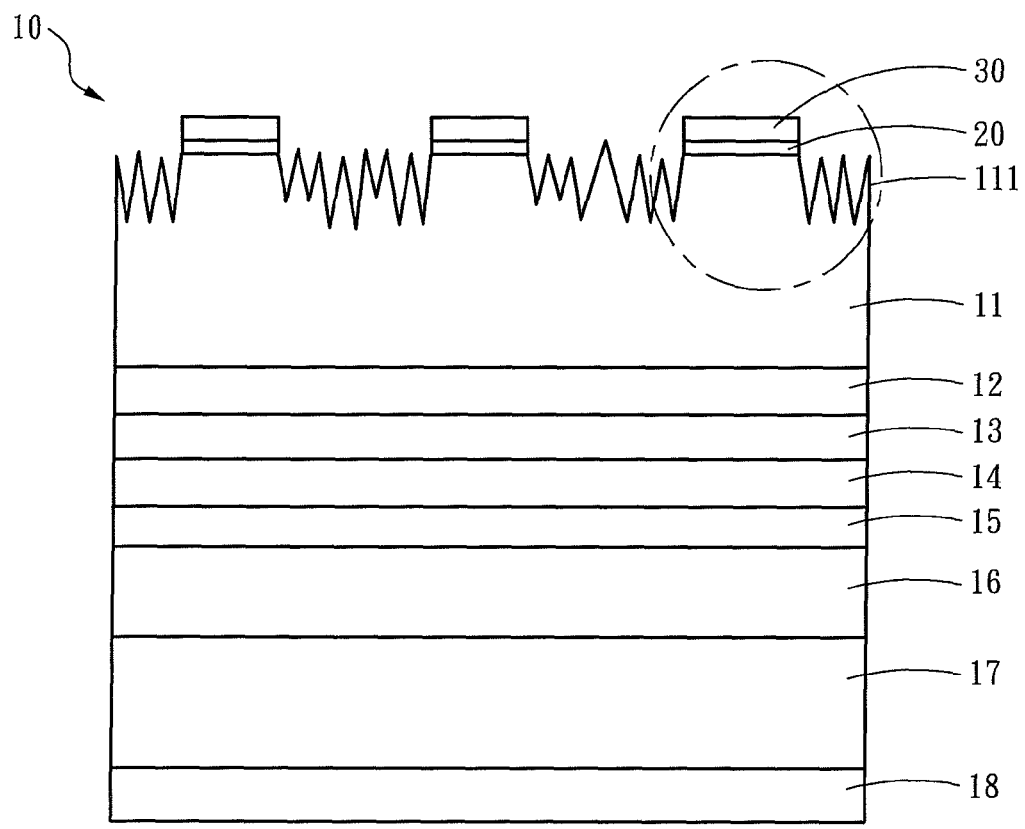
FIG. 2A is a schematic view of a first embodiment of the invention.
Figure 2B:
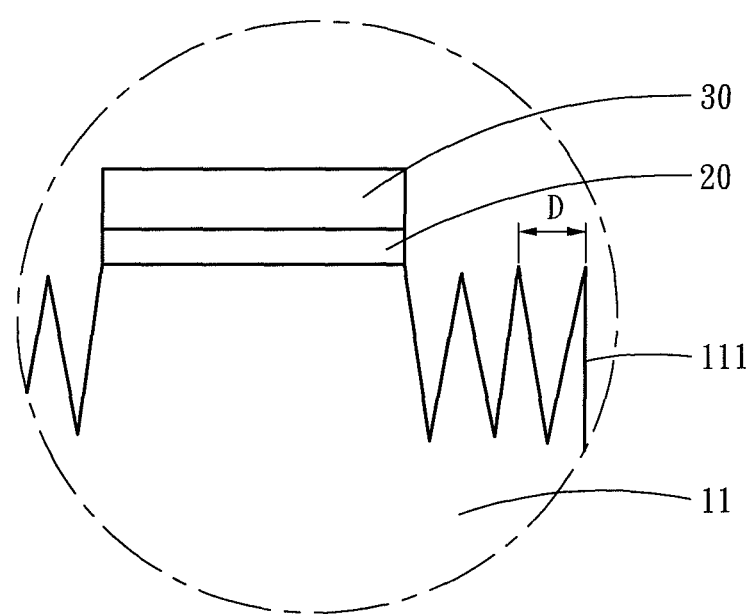
FIG. 2B is a fragmentary enlarged view according to FIG. 2A.

Please refer to FIGS. 2A and 2B for a first embodiment of the invention that is adopted for an LED 10. The LED 10 includes a nitride middle layer 20, an N-type metal electrode layer 30, an N-type semiconductor layer 11, a light emission layer 12 and a P-type semiconductor layer 13, and also has in this order under the P-type semiconductor layer 13, a mirror layer 14, a buffer layer 15, a bonding layer 16, a silicon substrate 17 and a P-type electrode 18. More specifically, the P-type semiconductor layer 13 is electrically connected the P-type electrode 18. The light emission layer 12 is formed on the P-type semiconductor layer 13 and contacts the P-type semiconductor layer 13. The N-type semiconductor layer 11 is formed on the light emission layer 12 and contacts the light emission layer 12.

The nitride middle layer 20 is patterned and formed on the N-type semiconductor layer 11 to contact the N-type semiconductor layer 11, and can be selected from the group consisting of aluminum nitride (AlN), titanium nitride (TiN) and chromium nitride (CrN), i.e. the composition of the nitride middle layer 20 can be Ti(X)N(1−X), Al(X)N(1−X) or Cr(X)N(1−X), where $0.05<X<0.15$.

In other words, the ratio of nitrogen and aluminum in the AlN is X:1−X, with the X between 0.05 and 0.15. Similarly, the ratio of nitrogen and titanium in TiN, and nitrogen and chromium in CrN also is X:1−X, with X between 0.05 and 0.15. The nitride middle layer 20 is preferably formed at a thickness between 10 nanometers and 500 nanometers. Since the nitride can maintain in a stable condition at high temperature to block diffusion of metal ions, the nitride middle layer 20 serves as a blocking interface to avoid the LED from aging rapidly. The area of the N-type semiconductor layer 11 without the nitride middle layer 20 has an irregular surface 111 to prevent total reflection and enhance light extraction efficiency. The irregular surface 111 can be formed through a physical method, such as plasma bombardment or the like.

The N-type metal electrode layer 30 is formed on the nitride middle layer 20, and only contacts the nitride middle layer 20. The nitride middle layer 20 is formed between the N-type semiconductor layer 11 and the N-type metal electrode layer 30 to prevent the N-type metal electrode layer 30 from contacting the N-type semiconductor layer 11. Besides, The N-type metal electrode layer 30 can be selected from the group consisting of aluminum, titanium, nickel, chromium, platinum and gold, and is formed at a thickness greater than 1

μm. The N-type metal electrode layer 30 also includes at least two types of metal materials that are interlaced and stacked.

Figure 3A:
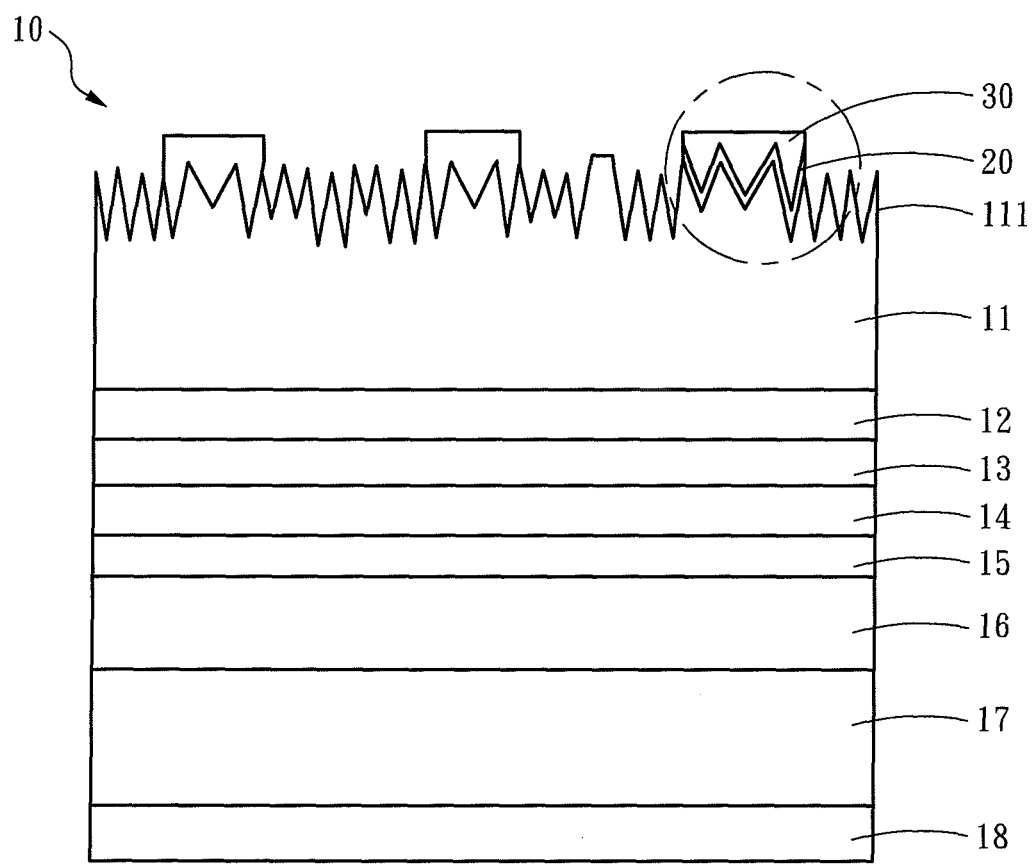
FIG. 3A is a schematic view of a second embodiment of the invention.
Figure 3B:
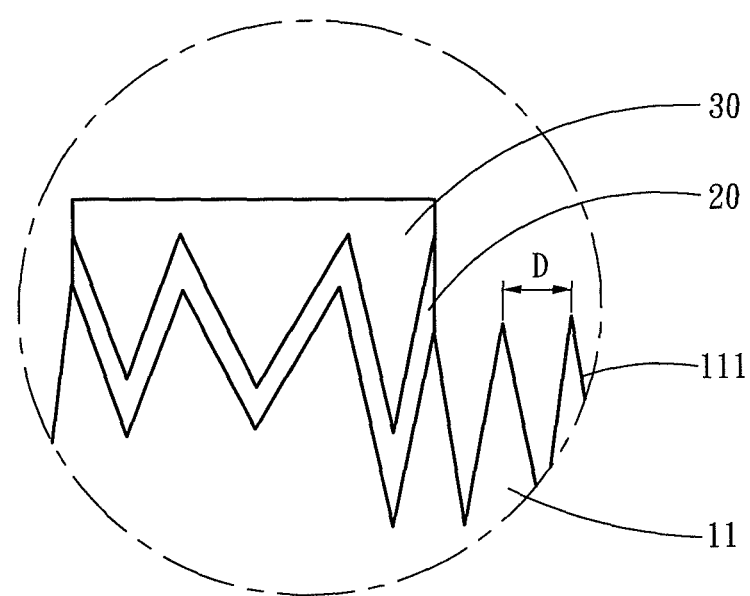
FIG. 3B is a fragmentary enlarged view according to FIG. 3A.

Please refer to FIGS. 3A and 3B for a second embodiment of the invention. In this embodiment, the N-type semiconductor layer 11 can have an irregular surface 111, and the nitride middle layer 20 and N-type metal electrode layer 30 are formed on the irregular surface 111 which can be a continuous serrated surface with a peak to peak distance D, preferably greater than 500 nanometers.

As a conclusion, as the nitride middle layer 20 of the invention is in contact with the N-type semiconductor layer to form Schottky contact, but the forward voltage would not be increased significantly, thus the nitride middle layer 20 can function as a blocking interface to block diffusion of metal ions to allow physical characteristics of the N-type semiconductor layer to be maintained stable at high temperature, so that the N-type semiconductor layer 11 can be prevented from being damaged by diffusion of the metal ions and its electric property also can be maintained stable. Moreover, the nitride middle layer 20 would not be softened and condensed to become a spherical shape due to high temperature, hence adhesion can be maintained and the N-type metal electrode layer 30 further can be prevented from peeling off. As a result, the lifespan of the LED can increase to meet use requirements.

What is claimed is:

1. A light emitting diode, comprising:
    a P-type electrode;
    a P-type semiconductor layer electrically connected the P-type electrode;
    a light emission layer formed on the P-type semiconductor layer and contacting the P-type semiconductor layer;
    an N-type semiconductor layer formed on the light emission layer and contacting the light emission layer, the N-type semiconductor layer including a planar contacting platform which is parallel to a bottom surface of the P-type electrode, and an irregular surface where no planar contacting platform is formed;
    a nitride middle layer patterned and formed on the planar contacting platform to contact the planar contacting platform; and
    an N-type metal electrode layer formed on the nitride middle layer and only contacting the nitride middle layer, wherein the nitride middle layer is formed between the N-type semiconductor layer and the N-type metal electrode layer to prevent the N-type metal electrode layer from contacting the N-type semiconductor layer.

2. The light emitting diode of claim 1, wherein the nitride middle layer is selected from the group consisting of aluminum nitride (AlN), titanium nitride (TiN) and chromium nitride (CrN).

3. The light emitting diode of claim 2, wherein composition ratio of nitrogen and aluminum in the aluminum nitride (AlN) is X:1−X, where X is between 0.05 and 0.15, wherein composition ratio of nitrogen and titanium in the titanium nitride (TiN) is X:1−X, where X is between 0.05 and 0.15, and wherein composition ratio of nitrogen and chromium in the chromium nitride (CrN) is X:1−X, where X is between 0.05 and 0.15.

4. The light emitting diode of claim 2, wherein the nitride middle layer is formed at a thickness between 10 nanometers and 500 nanometers.

5. The light emitting diode of claim 1, wherein the N-type metal electrode layer is selected from the group consisting of aluminum, titanium, nickel, chromium, platinum and gold.

6. The light emitting diode of claim 5, wherein the N-type metal electrode layer is formed at a thickness greater than 1 μm.

7. The light emitting diode of claim 5, wherein the N-type metal electrode layer includes at least two types of materials that are interlaced and stacked.

8. The light emitting diode of claim 1, wherein the irregular surface includes a peak to peak distance greater than 500 nanometers.

* * * * *